(12) United States Patent
Stuetzel et al.

(10) Patent No.: US 9,153,432 B2
(45) Date of Patent: Oct. 6, 2015

(54) MODIFICATION OF SILICON LAYERS FORMED FROM SILANE-CONTAINING FORMULATIONS

(75) Inventors: Bernhard Stuetzel, Marl (DE); Wolfgang Fahrner, Gundelfingen (DE)

(73) Assignee: Evonik Degussa GmbH, Essen (DE)

( * ) Notice: Subject to any disclaimer, the term of this patent is extended or adjusted under 35 U.S.C. 154(b) by 95 days.

(21) Appl. No.: 13/807,852

(22) PCT Filed: Jun. 20, 2011

(86) PCT No.: PCT/EP2011/060206
§ 371 (c)(1),
(2), (4) Date: Dec. 31, 2012

(87) PCT Pub. No.: WO2012/000815
PCT Pub. Date: Jan. 5, 2012

(65) Prior Publication Data
US 2013/0099236 A1 Apr. 25, 2013

(30) Foreign Application Priority Data
Jun. 30, 2010 (DE) .................. 10 2010 030 696

(51) Int. Cl.
| | | |
|---|---|---|
| H01L 21/02 | (2006.01) | |
| C23C 18/12 | (2006.01) | |
| C23C 18/14 | (2006.01) | |
| H01L 29/16 | (2006.01) | |
| H01L 31/0376 | (2006.01) | |
| H01L 31/075 | (2012.01) | |
| H01L 31/18 | (2006.01) | |

(52) U.S. Cl.
CPC ...... *H01L 21/02532* (2013.01); *C23C 18/1204* (2013.01); *C23C 18/1212* (2013.01); *C23C 18/1225* (2013.01); *C23C 18/1295* (2013.01); *C23C 18/14* (2013.01); *H01L 21/0262* (2013.01); *H01L 21/02123* (2013.01); *H01L 21/02318* (2013.01); *H01L 21/02587* (2013.01); *H01L 21/02628* (2013.01); *H01L 21/02664* (2013.01); *H01L 29/1604* (2013.01); *H01L 31/0376* (2013.01); *H01L 31/075* (2013.01); *H01L 31/1804* (2013.01); *Y02E 10/547* (2013.01); *Y02E 10/548* (2013.01)

(58) Field of Classification Search
CPC ................. H01L 21/02109; H01L 21/02123; H01L 21/02225; H01L 21/0226; H01L 21/02318; H01L 21/285
See application file for complete search history.

(56) References Cited

U.S. PATENT DOCUMENTS

| | | |
|---|---|---|
| 7,314,513 B1 | 1/2008 | Zuercher et al. |
| 7,981,482 B1 | 7/2011 | Zuercher et al. |
| 2006/0185712 A1 | 8/2006 | Shiho et al. |
| 2008/0022897 A1 | 1/2008 | Zurcher et al. |
| 2008/0271782 A1 | 11/2008 | Sharma |
| 2011/0189072 A1 | 8/2011 | Brausch et al. |
| 2012/0042951 A1 | 2/2012 | Stuetzel et al. |
| 2012/0199832 A1 | 8/2012 | Stuetzel et al. |
| 2012/0205654 A1 | 8/2012 | Stuetzel et al. |
| 2012/0291665 A1 | 11/2012 | Wieber et al. |

FOREIGN PATENT DOCUMENTS

| | | |
|---|---|---|
| CN | 1297578 A | 5/2001 |
| JP | 2003-192329 A | 7/2003 |
| JP | 2004-331480 A | 11/2004 |
| JP | 2005 178363 | 7/2005 |
| WO | WO 01/86707 A1 | 11/2001 |
| WO | 2004 038745 | 5/2004 |
| WO | 2011 104147 | 9/2011 |

OTHER PUBLICATIONS

Pivin, J., et al., "Exciton-erbium coupling in SiOx suboxide films prepared by combining sol-gel chemistry and ion implantation," Materials Science and Engineering B, vol. 97, No. 1, pp. 13-19, (Jan. 15, 2003) XP 4399808.

Belot, V., et al., "Sol-gel route to silicon suboxides—Preparation and characterization of silicon sesquioxide," Journal of Non-Crystalline Solids, vol. 127, No. 2, pp. 207-214, (Feb. 1, 1991) XP 24062925.

Mueller, T., et al., "Application of Wide-Bandgap Hydrogenated Amorphous Silicon Oxide Layers to Heterojunction Solar Cells for High Quality Passivation," IEEE, Total 6 Pages, (May 11, 2008) XP 2662198.

International Search Report Issued Nov. 11, 2011 in PCT/EP11/60206 Filed Jun. 20, 2011.

*Primary Examiner* — Cheung Lee
(74) *Attorney, Agent, or Firm* — Oblon, McClelland, Maier & Neustadt, L.L.P.

(57) ABSTRACT

The invention relates to a process for producing an oxygen-containing surface or interface of a silicon layer, which is arranged on a substrate, especially in the production of photovoltaic units.

21 Claims, No Drawings

MODIFICATION OF SILICON LAYERS FORMED FROM SILANE-CONTAINING FORMULATIONS

The invention relates to a process for producing an oxygen-containing surface or interface of a silicon layer, which is arranged on a substrate, especially in the production of photovoltaic units.

The conventional production of solar cells consists in the opposite doping of a doped semiconductor substrate by means of implantation or diffusion, or deposition of an oppositely doped semiconductor layer on a doped semiconductor substrate by means of epitaxy, or in the deposition of semiconductor layers of different doping from the gas phase under reduced pressure, or of variants of the processes mentioned. The disadvantage of all these processes is the economic investment and costs which are thus required.

To avoid the need for vacuum technology, high temperatures and/or an expensive substrate, attempts are made to produce layers or layer sequences from silanes in liquid phase.

The production of solar cells requires semiconductor layers of different doping with at least one pn junction. By depositing one or more layers of these silanes on a suitable substrate, it is possible to obtain one or more p-n junctions which act as a solar cell. The deposition is effected by means of an application apparatus suitable for thin layers, for example a spin-coater. The layers formed are stabilized by a suitable thermal treatment, such that they typically assume a mixture of microcrystalline, nanocrystalline and amorphous (polymorphic for short) structures. Unless stated explicitly, all microcrystalline, nanocrystalline and/or amorphous layers shall generally be referred to here as "polymorphic", since an exact distinction and definition is not possible with accuracy in most cases, or is of minor importance for the result achieved.

The way in which silicon layers are produced from silanes is known per se. For instance, GB 2077710 teaches the preparation of polysilanes of the general formula —$(SiH_2)_n$— where n≥10 by simultaneous reduction and polymerization of $SiH_2Cl_2$ with alkali metals. Such higher silanes are named as a precursor for silicon layers, for example for solar cells. In the case of the silanes $Si_nH_{2n+2}$ with relatively small values for n, namely n≤4, JP 7267621 teaches the production of silicon layers from films of such silanes, which are first irradiated with UV at low temperatures, at which such silanes have a low vapour pressure, and are then heated to temperatures above 400° C. In addition, EP 1284306 teaches that silicon films can be produced in a similar manner from cyclic silanes of the general formula $Si_nH_{2n}$ and open-chain silanes of the general formula $Si_nH_{2n+2}$, in each case where n=3 to 10. These silanes are partly or wholly oligomerized, for example by heating and/or UV irradiation. In addition, specific phosphorus compounds or boron compounds are added in order to achieve n- or p-doping.

In the prior art, these solutions are used to successively produce n- and p-doped silicon layers, by applying the liquid formulation to suitable conductive substrates, for example by spin-coating, and then converting it to silicon. The steps are
i) providing a substrate,
ii) providing a formulation containing at least one silicon compound and optionally a phosphorus or boron compound,
iii) coating the substrate with the formulation,
iv) irradiating and/or thermally treating the coated substrate to form an at least partly polymorphic layer consisting predominantly of silicon.

The silicon layers thus obtained typically comprise a mixture of microcrystalline, nanocrystalline and amorphous structures. Layers with such structures are called "polymorphic" here and hereinafter. In the conventional production of silicon layers outlined above, the problem occurs that losses occur at the p-n junctions, which, for example, in the case of a solar cell lower the efficiency thereof. The cause of these losses is defects in the silicon surface or interface of the differently doped silicon layers, which increase the recombination of charge carriers. In the well-known comparative case of heterojunction solar cells (amorphous silicon, aSi, on mono- or multicrystalline silicon, (m)cSi), the causes for the reduction in efficiency are known both in qualitative and quantitative terms (for example H. Angermann et al.: Optimisation of electronic interface properties of a-Si:H/c-Si hetero-junction solar cells by wet-chemical surface pre-treatment, Proceedings on Advanced Materials and Concepts for Photovoltaics EMRS 2007 Conference, Strasbourg, France, Fahrner, W. R. et al.: Simulation of Interface States in a-Si:H/mc-Si Heterojunction Solar Cells, 17th Workshop on Crystalline Silicon Solar Cells & Modules: Materials and Processes, Vail, Colorado USA, August 5-8 (2007). The crucial disruptive influence is surface states which, as recombination sites, destroy photogenerated useful charges and hence reduce the useful current to the load circuit. In terms of measurement technology, this destruction is viewed as increased surface recombination rate. Attempts are made in the following ways to reduce the level of dangling bonds (unsatisfied silicon bonds) or improve the surface properties:
(1) (Atomic) hydrogen is introduced to satisfy these free bonds.

In technical terms, this is done, for example, by diluting the silane with hydrogen in a PECVD deposition. This process has been substantially tried and tested and the chances of a further improvement are considered to be low. (2) A dielectric layer is deposited. Due to the high resistance thereof, this layer cannot be incorporated between a-Si and c-Si, but rather only on the side of the emitter facing away from the absorber. To tap the current on the emitter-side contacts, specific technological solutions are needed. In general, the dielectric passivations work via the field effect in such a way that incorporated charges at fixed locations repel generated minority charge carriers. (3) Further passivating layers are introduced between the doped aSi (as an emitter) and the cSi (as an absorber). The best-known case of such a passivating layer is intrinsic aSi (i-aSi).

A significant extension of this process—still based on heterojunction solar cells—consists in the replacement of the i-aSi layers by suboxides. In this case, the passive layers are applied to both sides of the absorber. With otherwise comparable parameters, an increase in the efficiency by about 2.5% to 19.5% was obtained (T. Muller et al.: Application of Wide Band Hydrogenated Amorphous Silicon Oxide (a-$SiO_x$:H) Layers to Heterojunction Solar Cells for High-Quality Passivation), 33rd IEEE Photovoltaic Specialists Conference, May 11-16, 2008, San Diego, Calif. The improvement is based essentially on a reduction in the surface recombination rate to 8-9 cm/sec. The a-$SiO_x$:H layers, like the intrinsic i-aSi:H layers, are produced by means of plasma-supported deposition from the gas phase, but with addition of oxygen or of an oxygenous gas, e.g. $CO_2$.

EP 1087 433 describes application of a polysilane film to a substrate and immediate thermal treatment under air and further treatment with $O_2$ and/or ozone ($O_3$) to obtain an $SiO_2$ layer. This layer then exhibits suitable properties as a dielectric in electronic components. US 2004/0248429 describes application of a polysilane film to a substrate and immediate exposure of the film to $O_2$ and/or $O_3$ and further thermal treatment under inert conditions to convert the polysilane film to an Si layer with an $SiO_2$ surface of particular thickness. However, an $SiO_2$ layer is disadvantageous for optoelectronic applications since it serves as a barrier layer.

It was thus an object of the present invention to provide a process with low technical complexity, which permits the production of semiconductive or conductive layers from liquid silane formulations and the modification of the surfaces or interfaces, such that defect sites are eliminated or reduced, and a sufficiently high efficiency, for example in solar cells produced therefrom, is achieved.

Surprisingly, the above-described difficulties are eliminated or reduced by either treating the surface of the silicon formed from liquid silane formulations with oxygen or suitable oxygen compounds, or adding oxygen or suitable oxygen compounds to the liquid silane formulations. In the case of the sequence of silicon p and n layers, defect sites are reduced in this way, such that an ipini or inipi junction or a pin or nip junction is present, which enables the production of a solar cell with increased efficiency.

The basic idea of the invention thus consists in passivating a solar cell which is produced on the basis of liquid silicon at the interfaces between p and i layers, n and i layers, and possibly between the metallization and the n or p layer. "n layers" and "p layers" shall be understood to mean layers with n-type and p-type conductivity respectively; "i layers" are undoped (intrinsic) layers.

In the process presented, the passivation is effected via surface or interface coverage of the active layers mentioned by means of a further layer, the production of which involves addition of oxygen or compounds containing oxygen. Such layers are referred to herein as undoped (intrinsic) suboxide layer "i-Si(subox)".

Suboxide layers in the context of the present invention are understood to mean layers of the formula SiOx (where $0<x<2$). Silicon suboxide layers are generally not electrical barrier layers.

The undoped (intrinsic) silicon suboxide layers, the undoped (intrinsic) silicon layers and the n-doped and p-doped silicon layers are preferably produced by means of liquid formulations containing at least one silicon compound. The suboxides are incorporated into the operation to produce the solar cell by introduction of oxygen compounds or oxygen and/or $O_3$ in some other form.

Specifically, the abovementioned object is achieved in accordance with the invention by a process for preparing at least one silicon layer arranged on a substrate, at least one of the silicon layers having suboxide structures on the surface thereof or suboxide structures throughout—including on the surface—, comprising the steps of:
 (a) providing a substrate,
 (b) providing a formulation containing at least one silicon compound, and optionally additionally containing solvents and/or dopants and/or further assistants,
 (c) applying the formulation to the substrate,
 (d) irradiating and/or thermally treating the coated substrate, so as to form an at least partly polymorphic layer consisting predominantly of silicon or a corresponding precursor layer consisting predominantly of polysilyne,
 (e) treating the layer obtained after step (d) with oxygen in the form of elemental oxygen and/or $O_3$, carbon dioxide, one or more oxygen compound(s) or a mixture thereof in pure form or in the form of a liquid or gaseous mixture, and
 (f) irradiating and/or thermally treating the coated substrate obtained after step (e),
 (g) optionally cooling the coating obtained after step d), so as to form an at least partly polymorphic layer which consists predominantly of silicon and has suboxide structures on its surface, or comprising the steps of:
 (a') providing a substrate,
 (b') providing a formulation containing at least one silicon compound and containing oxygen in the form of elemental oxygen and/or $O_3$, carbon dioxide, one or more oxygen compound(s) or a mixture thereof in pure form or in the form of a liquid or gaseous mixture, and optionally additionally containing solvents and/or further assistants,
 (c') applying the formulation to the substrate, and
 (d') irradiating and/or thermally treating the coated substrate obtained after step (c'),
 (e') optionally cooling the coating obtained after step (d'), so as to form an at least partly polymorphic layer which consists predominantly of silicon and has suboxide structures throughout.

In contrast to the prior art, steps a) to d) and step f), or a') to e'), are preferably performed under inert conditions. This ensures that a suboxide is formed with suitable optoelectronic properties. It is likewise crucial that steps d) and e) are not performed together.

"Inert conditions" in the context of the present invention are understood to mean that the oxygen content in the environment during the corresponding inventive process steps is less than 20 ppm. This is ensured by using appropriate inert gases. Examples of usable inert gases are nitrogen and/or noble gases, for example argon and helium, or mixtures thereof which have an oxygen content of less than 20 ppm. Preference is given to using nitrogen, argon or helium.

The at least partly polymorphic layer which consists predominantly of silicon, has suboxide structures on its surface and is formed in steps (c) to (f) or (c) to (g) preferably has a layer thickness of 5 to 3000 nm, more preferably of 5 to 500 nm. Preferred layer thicknesses are also in the range from 50 to 300 nm and 100 to 200 nm. The suboxide structure-containing surface, i.e. the layer formed in steps (e) to (f) or (e) to (g), preferably has a thickness of 1 to 50 nm, more preferably of 1 to 20 nm. The at least partly polymorphic layer which has suboxide structures throughout, consists predominantly of silicon and is formed in steps (b') to (d') or (b') to (e') preferably has a layer thickness of 5 to 100 nm, more preferably of 5 to 50 nm, especially preferably of 5 to 40 nm.

In a preferred embodiment of the process according to the invention, the treatment with oxygen in step (e) is effected by
 (i) contacting the layer with gaseous elemental oxygen and/or $O_3$, carbon dioxide, one or more oxygen compound(s) converted to gaseous form or a gas mixture thereof, or
 (ii) applying a liquid formulation comprising dissolved elemental oxygen and/or $O_3$, dissolved carbon dioxide, one or more oxygen compound(s) or a mixture thereof to the layer.

The alternative process regime comprising steps (a') to (e') is not ideal in every case since Si suboxides form not only on the surface but also in the layer throughout. In spite of this, this alternative can lead to usable or even good results. Usable results apply especially to thin, undoped silicon layers (layer thickness 40 nm or less). In contrast, the introduction of Si suboxides into thicker, undoped silicon layers (layer thickness 50 nm or more) leads to less good results. The introduction of Si suboxides into doped silicon layers with n-doping or p-doping generally does not show any improving effect.

The process according to the invention can also be operated in such a way that, as desired,
(i) steps (c) and (d) and/or
(ii) steps (e) and (f) and/or
(iii) steps (c') and (d') are each performed successively, overlapping in time or simultaneously.

As evident above, the process according to the invention is suitable for production of "at least one" silicon layer arranged on a substrate. In order to obtain several corresponding silicon layers on a substrate, process steps (b) to (f) or (b') to (d') can be conducted more than once. In the case of several runs through the process steps, the individual steps can each independently be configured specifically, such that the properties of each layer can be adjusted individually for the intended purpose. However, step e) or b') must be performed at least once.

The oxygen compound(s) mentioned in (e) or in (b') preferably comprise compounds of the general formula $R^1R^2SiR^3R^4$ where at least one of the $R^1$ to $R^4$ groups has the structure —O—R where R=H, an alkyl group, an aryl group or an alkylaryl group.

The $R^1$ to $R^4$ groups of the formula $R^1R^2SiR^3R^4$ which do not have the structure —o—R are preferably each independently selected from hydrogen, an alkyl group, an aryl group and an alkylaryl group.

In an alternative embodiment, said oxygen takes the form of $H_2O$, an alcohol, a diol, a triol, an aldehyde, a ketone, a carboxylic acid or a carbonic ester, preferably a carbonic ester of diols. One example of a suitable carbonic ester is propylene carbonate. Such carbonic esters contain a large amount of oxygen and can also be added to the formulation efficiently in step (b').

The substrate used generally has to be electrically conductive. In this case, useful arrangements are indeed all suitable arrangements with an electrically conductive surface. Illustrative substrates, for instance, consist of or are graphite, metal or graphite coated with alloy-forming metals (other than silicon). More particularly, the process according to the invention is suitable for all substrates in semiconductor wafer technology. Thus, options include substrates with surfaces of metals, metal alloys, graphite, conductive metal oxides, e.g. indium tin oxide (ITO), conductive carbon compounds or other conductive objects, for example metal flakes in a carbon matrix. Suitable examples are also insulators, for example glass, ceramic or heat-resistant polymers, coated with a conductive material. The conductive coatings may be over the full area or, in particular cases, only over part of the area. For example, in the case of conductively coated insulators, it should generally be ensured that the later coverage of the substrate with the silicon layer is not over the full area, in order that, in the case of photovoltaic arrangements, there remains a lateral conductive connection, for example for output conduction.

Useful substrates in principle also include semiconductor wafers, for example silicon wafers, or preferably n-type or p-type silicon wafers.

The substrate used may, however, also be a coated substrate which has already been produced by the process described here. The coated substrate may especially be an Si cell and/or an SiGe cell.

In a preferred embodiment of the process according to the invention, the silicon compound is a silicon-hydrogen compound, preferably of the general formula $Si_nH_{2n+2}$ where n=3 to 10, preferably n=4 to 8, or $Si_nH_{2n}$ where n=4 to 8, preferably n=5 and 6; a silicon halide; a silicon organyl; an oligomeric silicon compound $Si_nR_{2n+2}$ or $Si_nR_{2n}$ where n=8 to 100 and R=H, halogen, organyl, where each R may be selected independently; or any desired mixture of such silicon compounds. In addition, the compounds mentioned may be partly or wholly oligomerized to establish molar masses of 500 g/mol to 10 000 g/mol, preferably 800 g/mol to 5000 g/mol. In addition, the silicon compounds may also be partly or wholly oligomerized by irradiation or thermal treatment, in which case molar masses of 500 g/mol to 10 000 g/mol, preferably 800 g/mol to 5000 g/mol, more preferably 1000 g/mol to 3000 g/mol, may be established.

Particular preference is given to using silicon-hydrogen compounds, i.e. silanes and oligo- or polysilanes, since they have a high silicon content based on the molar mass of the compounds. Among the silanes, suitable examples for the process according to the invention are particularly those of the general formula $Si_nH_{2n+2}$ where n=3 to 10, preferably n=4 to 8, or $Si_nH_{2n}$ where n=4 to 8, preferably n=5 and 6. Very particularly suitable are oligomers which have been prepared from these silanes, in which case molar masses of 500 g/mol to 10 000 g/mol, preferably 800 g/mol to 5000 g/mol, more preferably 1000 g/mol to 3000 g/mol, may be established.

The silicon-containing formulation used in the process according to the invention is typically a liquid formulation. This consists of the aforementioned silicon compounds, optionally in a mixture with solvents. Suitable solvents are, for example, room temperature liquid aliphatic or aromatic hydrocarbons and mixtures thereof. Examples are n-pentane, n-hexane, n-heptane, n-octane, n-decane, dodecane, cyclohexane, cyclooctane, cyclodecane, dicyclopentane, benzene, toluene, m-xylene, p-xylene, mesitylene, indane, indene, tetrahydronaphthalene, decahydronaphthalene, diethyl ether, dipropyl ether, ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, tetrahydrofuran, p-dioxane, acetonitrile, dimethylformamide, dimethyl sulphoxide, dichloromethane and chloroform. The viscosity of the coating solution is preferably 1 to 2000 mPas.

In one variant of the process according to the invention, the silicon-containing formulation can be prepared by oligomerizing and/or polymerizing a mixture containing at least one higher silane of the general formula $Si_nH_{2n+2}$ where n=3 to 10, preferably n=4 to 8, or $Si_nH_{2n}$ where n=4 to 8, preferably n=5 and 6. For oligomerization by means of UV radiation or heat treatment, higher silanes of the aforementioned formulae where n ≥3 are used. In this way, a liquid low-viscosity mixture can be used to prepare, in one step, a desired higher-viscosity liquid mixture containing oligo-/polysilanes.

It is optionally possible to additionally add solvents, dopants and/or further assistants. These further agents or substances may each independently be added to the mixture actually before the oligomerization and/or polymerization, or only thereafter. If dopants are added to the mixtures, these may be in the case of n-doping, for example, phosphorus compounds, for instance phenylphosphine, and in the case of p-doping, for example, boron compounds, for instance decaborane-14. In this case too, the oligomerization and/or polymerization can partly or wholly be effected by irradiation or thermal treatment, in which case molar masses of 500 g/mol to 10 000 g/mol, preferably 800 g/mol to 5000 g/mol, more preferably 1000 g/mol to 3000 g/mol, may be established. The proportion of solvent based on the throughout formulation may be 5 to 95% by weight, preferably 25 to 93% by weight, more preferably 50 to 93% by weight.

The substrate can be coated with the silicon-containing formulation in a known manner, preferably by casting or knife-coating or processes selected from printing or coating processes (especially flexographic/gravure printing, inkjet printing, offset printing, digital offset printing and screen printing), spraying processes, rotary coating processes ("spin-coating"), dipping processes ("dip-coating"), and processes selected from meniscus coating, slit coating, slot-die coating and curtain coating.

The thermal treatment of the coated substrate can be effected in one, more than one or all of steps (d), (d') and/or (f) in a known manner, where step d) in the first embodiment of the process according to the invention has to be effected in each case. For instance, the substrate coated with the formulation can be heated preferably to temperatures of 200 to 1000° C., preferably 250 to 700° C., more preferably 250 to 600° C. This forms, in accordance with the invention, an at least partly polymorphic layer consisting predominantly of silicon. In the case of freshly produced layers, it is also possible to effect preceding curing by crosslinking with a UV lamp (for example wavelength 254 nm, power 15 watts or wavelength 180 nm). In a preferred embodiment of the process according to the invention, the coated substrate is sent to a thermal treatment without irradiation. Useful heating units include, for example, hotplates, infrared fields, tubular furnaces or muffle furnaces, each with substantial exclusion of $O_2$ and $H_2O$ apart from the very small amounts of oxygen introduced deliberately to achieve the suboxide layers. The total amount of oxygen must not be so high that $SiO_2$ forms. The temperatures range from 200° C. to 1000° C. The layers can also preferably be aftertreated by heating under forming gas mixtures of hydrogen and nitrogen or of hydrogen and argon (e.g. $H_2/N_2$ in a volume ratio of 5/95 to 10/90 or $H_2/Ar$ in a volume ratio of 5/95 to 10/90) at temperatures of 250° C. to 700° C., preferably 250° C. to 500° C.

The present invention also provides a coated substrate comprising one of the following layer sequences:
substrate//i-Si(subox),
substrate//i-Si//i-Si(subox),
substrate//n-Si//i-Si(subox)//i-Si//i-Si(subox)//p-Si,
substrate//p-Si//i-Si(subox)//i-Si//i-Si(subox)//n-Si,
substrate//i-Si(subox)//n-Si//i-Si(subox)//i-Si//i-Si (subox)//p-Si//i-Si(subox), or
substrate//i-Si(subox)//p-Si//i-Si(subox)//i-Si//i-Si (subox)//n-Si//i-Si(subox),
substrate//n-Si// p-Si//p-Si(subox)//n-Si//i-Si// p-Si
substrate//p-Si// n-Si//n-Si(subox)//p-Si//i-Si// n-Si
substrate//n-Si// i-Si//p-Si//p-Si(subox)//n-Si//i-Si// p-Si
substrate//p-Si// i-Si//n-Si//n-Si(subox)//p-Si//i-Si// n-Si
"i-Si(subox)" in the context of the invention is understood to mean an at least partly polymorphic, undoped (intrinsic) layer which consists predominantly of silicon and has suboxide structures on the surface thereof or suboxide structures throughout.

"i-Si" is understood to mean an undoped layer consisting predominantly of silicon, preferably an undoped layer consisting of silicon. "n-Si" is understood to mean an n-type-doped layer consisting predominantly of silicon, and "p-Si" to mean a corresponding p-type-doped layer. The symbol "//" indicates the transition to the next layer in each case.

Preferred layer sequences are
substrate//i-Si//i-Si(subox),
substrate//n-Si//i-Si(subox)//i-Si//i-Si(subox)//p-Si,
substrate//p-Si//i-Si(subox)//i-Si//i-Si(subox)//n-Si,
substrate//i-Si(subox)//n-Si//i-Si(subox)//i-Si//i-Si (subox)//p-Si//i-Si(subox), and
substrate//i-Si(subox)//p-Si//i-Si(subox)//i-Si//i-Si (subox)//n-Si//i-Si(subox).

substrate//n-Si//p-Si//p-Si(subox)//n-Si//i-Si//p-Si
substrate//p-Si//n-Si//n-Si(subox)//p-Si//i-Si//n-Si
substrate//n-Si//i-Si//p-Si//p-Si(subox)//n-Si//i-Si//p-Si
substrate//p-Si//i-Si//n-Si//n-Si(subox)//p-Si//i-Si//n-Si Preferably, the suboxide layers i-Si(subox), p-Si(subox) and n-Si(subox) are produced by processes according to the present invention. Most preferably, all layers are produced by a liquid phase process.

The i-Si layers preferably have a layer thickness of 5 to 3000 nm, more preferably of 5 to 500 nm.

The i-Si(subox), p-Si(subox) and n-Si(subox) layers preferably have a layer thickness of 1 to 50 nm, more preferably of 1 to 40 nm, especially preferably of 1 to 20 nm.

For the layer which is formed in the step sequence d), e) and f) and consists of i-Si and i-Si(subox), the abovementioned preferred layer thickness of i-Si applies, namely preferably 10 to 3000 nm, more preferably of 20 to 500 nm. For the i-Si (subox) content, the preferred layer thickness is 1 to 20 nm, more preferably 1 to 15 nm, especially preferably 1 to 10 nm.

The n-Si and p-Si layers preferably have a layer thickness of 10 to 3000 nm, more preferably of 20 to 500 nm.

The abovementioned illustrative layer sequences preferably do not comprise any further intermediate layers within the particular layer sequence. Nevertheless, further layers arranged further to the outside may be provided. The substrate used may be, for example, a multilayer substrate. It is also possible for further functional layers to be disposed on the layer mentioned last in each case. There is also no intention to rule out the possibility that further intermediate layers may in fact be provided within the particular layer sequences.

The process according to the invention can produce the Si(subox) layers in a very advantageous manner compared to plasma-supported deposition from the gas phase (PECVD process). The PECVD process, which can be employed at temperatures of appropriately up to 300° C., does also permit a certain polymorphism of the silicon or of the a-SiO$_x$:H layers by variation of the process regime via the frequency in the plasma generation and the hydrogen content in the gas phase. However, the process according to the invention not only allows simple production of the layers; it also enables simpler variation of the polymorphism solely through the thermal treatment of the layers, it being possible to employ temperatures up to 1000° C. This wide temperature range additionally enables improved optimization of the Si(subox) layers.

Useful substrates include all abovementioned materials and arrangements.

The present invention further provides a photovoltaic unit, especially a solar cell or solar cell combinations, which has been produced or can be produced using the process according to the invention described here or variants thereof.

The present invention especially also encompasses the use of oxygen in the form of elemental oxygen, carbon dioxide, one or more oxygen compound(s) or a mixture thereof in pure form or in the form of a liquid or gaseous mixture for silicon suboxide structures in the production of an at least partly polymorphic layer which consists predominantly of silicon, said layer having the suboxide structures on its surface or throughout.

EXAMPLES

The layer thickness reported was measured with a Profilometer, KLA Tencor, P15 instrument type from KLA-Tencor Corporation, Film and Surface Technology, 160 Rio Robles, San Jose, Calif. USA 951 34.

Example 1

Production of an Undoped Si Layer (i-Si Layer)

1a) Layer Thicknesses 100 nm to 200 nm

In a glovebox with an argon atmosphere which has an oxygen concentration of 0.5 ppm and a water content not exceeding 0.5 ppm, 5 g of cyclopentasilane in an open vessel were irradiated with a UV lamp of wavelength 254 nm and power 15 watts at a distance of 6 cm over a period of 15 min. In the course of this, the mobile silane became more viscous.

With the aid of gel permeation chromatography (GPC), using a polystyrene calibration curve, the weight-average molecular weight of the higher molecular weight component of the viscous silane mixture was determined to the Mw=2400 g/mol. In addition, the mixture still contained residues of monomeric cyclopentasilane.

The mixture was diluted with toluene such that the mixture consists of 1 part by weight of silane and 3 parts by weight of toluene, and was applicable with the aid of a spin-coater to a silver-coated quartz blank of size 2.5 cm·2.5 cm. Subsequently, a hotplate was used to heat the layer to 500° C. for a period of 2 min. This formed a dark, essentially oxygen-free undoped silicon layer on the metallic substrate. It is designated as "i-Si" for short. The layer thickness was 140 nm.

1 b) Layer Thicknesses of 5 nm to 40 nm

The procedure described in 1a) was repeated, with the difference that the produced mixture of cyclopentasilane oligomers with a weight-average molecular weight of the higher molecular weight component of Mw=2400 g/mol and residues of monomeric cyclopentasilane were not diluted with 3 parts of toluene but with 6 parts of toluene. This reduces the layer thickness compared to Example 1a). The layer thickness was 25 nm.

Example 2

Production of an n-doped Si Layer (n-Si Layer)

Example 1a) was carried out, but with the difference that a cooligomer of phenylphosphine and cyclopentasilane with a weight-average molecular weight Mw=2200 g/mol was added as a dopant together with the toluene in the course of dilution to the mixture of oligomeric and monomeric cyclopentasilane produced by UV irradiation.

The mixture was applied with the aid of a spin-coater to a silver-coated quartz blank of size 2.5 cm·2.5 cm. Subsequently, a hotplate was used to heat the layer to 500° C. for a period of 2 min. This formed a dark, essentially oxygen-free, n-doped silicon layer on the metallic substrate. It is designated as "n-Si" for short. The layer thickness was 170 nm.

Example 3

Production of a p-doped Si Layer (p-Si Layer)

Example 1a) was carried out, but with the difference that a cooligomer of decaborane-14 and cyclopentasilane with a weight-average molecular weight Mw=2500 g/mol was added as a dopant together with the toluene in the course of dilution to the mixture of oligomeric and monomeric cyclopentasilane produced by UV irradiation.

The mixture was applied with the aid of a spin-coater to a silver-coated quartz blank of size 2.5 cm·2.5 cm. Subsequently, a hotplate was used to heat the layer to 500° C. for a period of 2 min. This formed a dark, essentially oxygen-free, p-doped silicon layer on the metallic substrate. It is designated as "p-Si" for short. The layer thickness was 180 nm.

Example 4

Production of A Homogeneous, Undoped Si Layer With Suboxide Structures by Introducing Oxygen in Step (b')

In a glovebox with an argon atmosphere, the preparation, described in Example 1a), of a mixture of oligomeric and monomeric cyclopentasilane by UV irradiation was repeated. The oligomeric component had a weight-average molecular weight $M_w$ of 2500 g/mol, measured by means of GPC.

The mixture was first diluted with toluene such that a mixture of 1 part by weight of silane and 5 parts by weight of toluene was obtained. Thereafter, 1 part by weight of a solution of a 1 part by weight of isobutyltrimethoxysilane in 20 parts by weight of toluene was added.

The mixture was applied with the aid of a spin-coater to a silver-coated quartz blank of size 2.5 cm·2.5 cm. Subsequently, a hotplate was used to heat the layer to 500° C. for a period of 2 min. This formed a dark, oxygen-containing, undoped silicon layer on the metallic substrate; it is designated as "i-Si(subox)" for short. The layer thickness was 20 nm.

Example 5

Production of an Undoped Si Layer With Suboxide Structures at the Surface, Introduction of Oxygen in Step (E)

In a glove box with an argon atmosphere, the production, described in Example 1, of a mixture of oligomeric and monomeric cyclopentasilane by UV irradiation was repeated. The oligomeric component had a weight-average molecular weight $M_w$ of 2500 g/mol, measured by means of GPC.

The mixture was first diluted with toluene such that the mixture of 1 part by weight of silane and 3 parts by weight of toluene was obtained.

The mixture was applied with the aid of a spin-coater to a silver-coated quartz blank of size 2.5 cm·2.5 cm. Subsequently, a hotplate was used to heat the layer to 280° C. for a period of 30 seconds. This formed a dark orange, undoped silicon precursor layer on the metallic substrate.

After cooling, a solution of 5 parts by weight of isobutyltrimethoxysilane in 95 parts by weight of toluene is applied via spin-coating to the precursor layer. Subsequently, a hotplate was used to heat the layer to 500° C. for a period of 2 min. This formed a dark, undoped silicon layer on the metallic substrate which has suboxidic structures only at the surface, such that a layer sequence of i-Si and i-Si(subox) is already present here. This is referred to as "i-Si//i-Si(subox)" for short. The thickness of the double layer totalled 23 nm.

Example 6

Layer Sequence for Production of a Thin-Layer Nip Solar Cell Comprising Suboxide First, as described in Example 2, an n-doped Si layer=n-Si was produced on a metallic substrate. The layer thickness was 350 nm. In modifications of Example 6, the layer thickness may also be within the range between 50 nm and 500 nm.

This arrangement served as a new substrate, and which, as described in Example 4, an oxygen-containing undoped silicon layer =i-Si(subox) was applied. The layer thickness was 20 nm. In modifications, the layer thickness may be within the range between 5 nm and 50 nm.

This was followed by the application of an undoped Si layer with suboxide structures at the surface=i-Si//i-Si (subox), as described in Example 5. The layer thickness was 140 nm. In modifications, the layer thickness may be within the range between 5 nm and 500 nm.

Thereafter, following the description in Example 3, a p-doped silicon layer =p-Si was applied. The layer thickness was 80 nm. In modifications, the layer thickness may be within the range between 20 nm and 500 nm.

In short form, the layer sequence obtained is then:
Metal substrate//n-Si//i-Si(subox)//i-Si//i-Si(subox)//p-Si

Example 7

Layer Sequence for Production of a Thin-Layer Pin Solar Cell Comprising Suboxide First, as described in Example 3, a p-doped Si layer=p-Si was produced on a metallic substrate. The layer thickness was 400 nm. In modifications of Example 7, the layer thickness may be within the range between 50 nm and 500 nm.

This arrangement served as a new substrate, on which, as described in Example 4, an oxygen-containing undoped silicon layer=i-Si(subox) was applied. The layer thickness was 25 nm. In modifications, the layer thickness may be within the range between 5 nm and 50 nm.

This was followed by the application of an undoped Si layer with suboxide structures at the surface=i-Si//i-Si (subox), as described in Example 5. The layer thickness was 120 nm. In modifications, the layer thickness may be within the range between 5 nm and 50 nm.

Thereafter, following the description in Example 2, an n-doped silicon layer =n-Si was applied.

The layer thickness was 70 nm. In modifications, the layer thickness may be within the range between 20 nm and 500 nm.

In short form the layer sequence obtained is then:
Metal substrate//p-Si//i-Si(subox)//i-Si//i-Si(subox)//n-Si

Example 8

Layer Sequence for Production of a Thin-Layer Inipi Solar Cell Comprising Suboxide The procedure was as in Example 6, with additional application, as the first step, of an i-Si(subox) layer according to Example 4 on the metal substrate, and further additional application, as the last step, likewise of an i-Si(subox) layer according to Example 4.

In short form, the layer sequence obtained is then: Metal substrate//i-Si(subox)//n-Si//i-Si(subox)//i-Si//i-Si(subox)//p-Si//i-Si(subox)

Example 9

Layer Sequence for Production of a Thin-Layer Ipini Solar Cell Comprising Suboxide The procedure was as in Example 7, with additional application, as the first step, of an i-Si(subox) layer according to Example 4 on the metal substrate, and further additional application, as the last step, likewise of an i-Si(subox) layer according to Example 4.

In short form, the layer sequence obtained is then:
Metal substrate//i-Si(subox)//p-Si//i-Si(subox)//i-Si//i-Si(subox)//n-Si//i-Si(subox)

The invention claimed is:

1. A process for preparing a silicon layer on a substrate, the silicon layer comprising silicon and a surface suboxide structure, the process comprising:
    (I) applying a formulation comprising at least one silicon compound to the substrate, to obtain a coated substrate;
    (II) irradiating, thermally treating, or irradiating and thermally treating the coated substrate to form a silicon layer;
    (III) treating the silicon layer with at least one oxygen source selected from the group consisting of elemental oxygen, $O_3$, carbon dioxide, and an oxygen-comprising compound, wherein the oxygen source is in pure form or a liquid or gaseous mixture; and
    (IV) irradiating, thermally treating, or irradiating and thermally treating the oxygen treated coated substrate, to form the silicon layer comprising suboxide structures on a surface of the layer.

2. The process of claim 1, wherein the treatment of the silicon layer with the at least one oxygen source (III) is effected by either:
    i) contacting the silicon layer with at least one oxygen source selected from the group consisting of gaseous elemental oxygen, gaseous $O_3$, gaseous carbon dioxide, and the oxygen-comprising compound, which has been converted to a gaseous form; or
    ii) applying to the silicon layer a liquid formulation comprising at least one oxygen source selected from the group consisting of dissolved elemental oxygen, dissolved $O_3$, dissolved carbon dioxide, and the oxygen-comprising compound.

3. The process of claim 1, further comprising:
repeating (I), (II), (III), and (IV), to form a further silicon layer comprising suboxide structures on the surface of the silicon layer.

4. The process of claim 1, wherein the oxygen source is the oxygen-comprising compound, and the oxygen-comprising compound is at least one selected from the group consisting of $H_2O$, an alcohol, a diol, a triol, an aldehyde, a ketone, a carboxylic acid, a carbonic ester, and a compound of formula (I)

$$R^1R^2SiR^3R^4 \qquad (I)$$

wherein, in formula (I), at least one of $R^1$ to $R^4$ comprises a structure of —O—R, wherein R is H, an alkyl group, an aryl group, or an alkylaryl group.

5. The process of claim 1, wherein the substrate is electrically conductive or comprises an electrically conductive surface.

6. The process of claim 1, wherein the silicon compound of the formulation is at least one selected from the group consisting of:
    a silicon-hydrogen compound of formula (a):

$$Si_nH_{2n+2} \qquad (a),$$

wherein n is 3 to 10:,
    a silicon-hydrogen compound of formula (b):

$$Si_nH_{2n} \qquad (b),$$

wherein n is 4 to 8;
    a silicon halide;
    a silicon organyl;
    an oligomeric silicon compound of formula (c):

$$Si_nR_{2n+2} \qquad (c),$$

wherein n 8 to 100, and each R is independently a hydrogen, a halogen, or an organyl; and
an oligomeric silicon compound of formula (d):

$$Si_nR_{2n} \qquad (d)$$

wherein n is 8 to 100, and each R is independently a hydrogen, a halogen, or an organyl.

7. The process of claim 1, wherein the formulation is a liquid formulation comprising a solvent, and wherein a viscosity of the liquid formulation is from 1 to 2000 mPas.

8. The process of claim 1, wherein the substrate is coated by: casting; knife-coating; casting and knife-coating; printing; spraying; rotary coating; dipping; meniscus coating; slit coating; slot-die coating; or curtain coating.

9. The process of claim 1, wherein the coated substrate, the oxygen treated coated substrate, or both, is thermally treated at a temperature of from 200 to 1000° C.

10. A photovoltaic unit, produced by the process of claim 1.

11. A coated substrate comprising a layer sequence, wherein the layer sequence is either:
substrate//i-Si(subox),
substrate//i-Si//i-Si(subox),
substrate//n-Si//i-Si(subox)//i-Si//i-Si(subox)//p-Si,
substrate//p-Si//i-Si(subox)//i-Si//i-Si(subox)//n-Si,
substrate//i-Si(subox)//n-Si//i-Si(subox)//i-Si//i-Si(subox)//p-Si//i-Si(subox); or
substrate//i-Si(subox)//p-Si//i-Si(subox)//i-Si//i-Si(subox)//n-Si//i-Si(subox),
substrate//n-Si//p-Si//p-Si(subox)//n-Si//i-Si//p-Si
substrate//p-Si//n-Si//n-Si(subox)//p-Si//i-Si//n-Si
substrate//n-Si//i-Si//p-Si//p-Si(subox)//n-Si//i-Si//p-Si
substrate//p-Si//i-Si//n-Si//n-Si(subox)//p-Si//i-Si//n-Si;
wherein i-Si(subox), p-Si(subox) and n-Si(subox) are an at least partly polymorphic layer comprising silicon and comprising suboxide structures on a surface thereof or throughout.

12. The coated substrate of claim 11, wherein the substrate is electrically conductive or comprises an electrically conductive surface.

13. A process for producing an at least partly polymorphic layer comprising silicon and comprising suboxide structures on a surface thereof or throughout, the process comprising:
treating with at least one oxygen source selected from the group consisting of elemental oxygen, carbon dioxide, an oxygen-comprising compound, wherein the oxygen source is in pure form or a liquid or gaseous mixture.

14. A process for preparing a silicon layer on a substrate, the silicon layer comprising polymorphic silicon and suboxide structures throughout the layer, the process comprising:
(I') coating the substrate with a formulation comprising at least one silicon compound and at least one oxygen source selected from the group consisting of elemental oxygen, O₃, carbon dioxide, and an oxygen-comprising compound, wherein the oxygen source is in pure form or a liquid or gaseous mixture, and
(II') irradiating, thermally treating, or irradiating and thermally treating the coated substrate, to form the at least partly polymorphic layer of silicon comprising suboxide structures throughout.

15. The process of claim 14, further comprising: repeating (I') and (II'), to form a further at least partly polymorphic silicon layer comprising suboxide structures throughout.

16. The process of claim 14, wherein the oxygen source is the oxygen-comprising compound, and the oxygen-comprising compound is at least one selected from the group consisting of $H_2O$, an alcohol, a diol, a triol, an aldehyde, a ketone, a carboxylic acid, a carbonic ester, and compound of formula (I):

$$R^1R^2SiR^3R^4 \qquad (I),$$

wherein, in formula (I): at least one of $R^1$ to $R^4$ comprises a structure of —O—R, wherein R is H, an alkyl group, an aryl group or an alkylaryl group.

17. The process of claim 14, wherein the substrate is electrically conductive or comprises an electrically conductive surface.

18. The process of claim 14, wherein the silicon compound of the formulation is at least one in the group consisting of:
a silicon-hydrogen compound of formula (a):

$$Si_nH_{2n+2} \qquad (a),$$

wherein n is 3 to 10:,
a silicon-hydrogen compound of formula (b):

$$Si_nH_{2n} \qquad (b),$$

wherein n is 4 to 8;
a silicon halide;
a silicon organyl;
an oligomeric silicon compound of formula (c):

$$Si_nR_{2n+2} \qquad (c),$$

wherein n is 8 to 100, and each R is independently a hydrogen, a halogen, or an organyl; and
an oligomeric silicon compound of formula (d):

$$Si_nR_{2n} \qquad (d)$$

wherein n is 8 to 100, and each R is independently a hydrogen, a halogen, or an organyl.

19. The process of claim 14, wherein the formulation is a liquid formulation comprising a solvent, and wherein a viscosity of the liquid formulation is from 1 to 2000 mPas.

20. The process of claim 14, wherein the substrate is coated by: casting; knife-coating;, casting and knife-coating; printing; spraying; rotary coating; dipping; meniscus coating; slit coating; slot-die coating; or curtain coating.

21. The process of claim 14, wherein the coated substrate is thermally treated at a temperature of from 200 to 1000° C.

* * * * *